(12) United States Patent
Al-Absi et al.

(10) Patent No.: US 12,184,256 B2
(45) Date of Patent: *Dec. 31, 2024

(54) ACTIVE INDUCTIVE SIMULATOR AND IMPEDANCE MULTIPLIER

(71) Applicant: KING FAHD UNIVERSITY OF PETROLEUM AND MINERALS, Dhahran (SA)

(72) Inventors: Muneer A. Al-Absi, Dhahran (SA); Abdulaziz Al-Khulaifi, Dhahran (SA)

(73) Assignee: KING FAHD UNIVERSITY OF PETROLEUM AND MINERALS, Dhahran (SA)

( * ) Notice: Subject to any disclaimer, the term of this patent is extended or adjusted under 35 U.S.C. 154(b) by 0 days.

This patent is subject to a terminal disclaimer.

(21) Appl. No.: 18/804,325

(22) Filed: Aug. 14, 2024

(65) Prior Publication Data
US 2024/0405752 A1    Dec. 5, 2024

Related U.S. Application Data

(63) Continuation of application No. 17/901,434, filed on Sep. 1, 2022, now Pat. No. 12,126,315.

(51) Int. Cl.
*H03H 11/48* (2006.01)
*H03H 11/40* (2006.01)
*H03H 11/44* (2006.01)

(52) U.S. Cl.
CPC ......... *H03H 11/486* (2013.01); *H03H 11/405* (2013.01); *H03H 11/44* (2013.01)

(58) Field of Classification Search
CPC ..... H03H 11/405; H03H 11/44; H03H 11/486
See application file for complete search history.

(56) References Cited

U.S. PATENT DOCUMENTS

| 9,184,734 | B1 * | 11/2015 | Abuelma'atti | ........... H03K 4/52 |
|---|---|---|---|---|
| 11,329,631 | B1 | 5/2022 | Al-Absi | |
| 2005/0134409 | A1 | 6/2005 | Gandhi | |

OTHER PUBLICATIONS

Barile, et al. ; A New Rail-to-Rail Second Generation Voltage Conveyor ; MDPI Electronics, 8 ; Nov. 5, 2019 ; 12 Pages.
(Continued)

*Primary Examiner* — Quan Tra
(74) *Attorney, Agent, or Firm* — Oblon, McClelland, Maier & Neustadt, L.L.P.

(57) ABSTRACT

A tunable grounded positive and negative active inductor simulator and impedance multiplier circuit and a method for implementing the tunable grounded positive and negative active inductor simulator and impedance multiplier circuit are described. The circuit includes one second generation voltage-mode conveyor circuit (VCII+), a voltage source configured to generate an output current, a first impedance, a second impedance and an operational transconductance amplifier OTA. The first impedance is connected between the voltage source and the positive VCII+ input terminal, Y. The second impedance is connected between the second output terminal and a ground terminal. The OTA is configured to have a transconductance gain. The circuit is configured to be tuned by a selection of values for the first and second impedances.

10 Claims, 8 Drawing Sheets

(56) References Cited

OTHER PUBLICATIONS

Basak, et al. ; Electronically tunable grounded inductance simulators and capacitor multipliers realization by using single Current Follower Transconductance Amplifier (CFTA) ; Analog Integrated Circuits and Signal Processing ; Apr. 27, 2022 ; 6 Pages.

Stornelli, et al. ; AEU—International Journal of Electronics and Communications, vol. 137 ; Jul. 2021 ; 3 Pages ; Abstract Only.

Al-Absi ; Realization of a Large Values Floating and Tunable Active Inductor ; Digital Object Identifier ; Apr. 12, 2019 ; 5 Pages.

\* cited by examiner

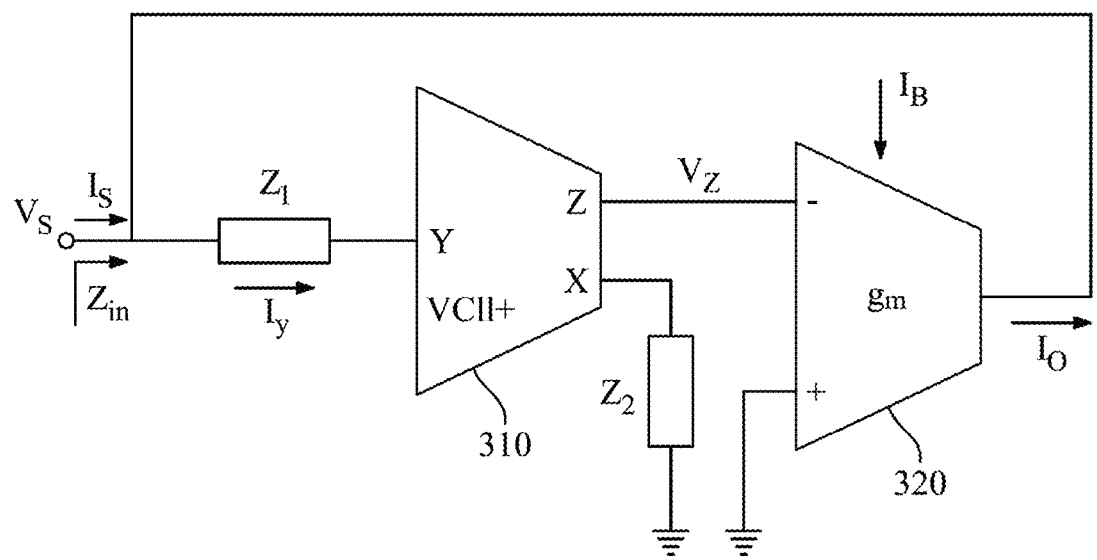
FIG. 3
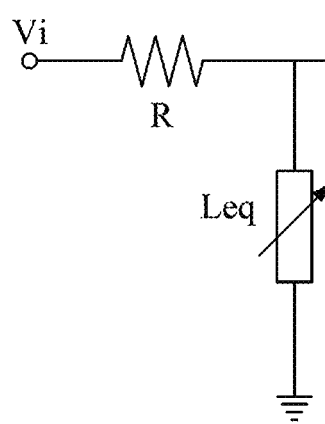
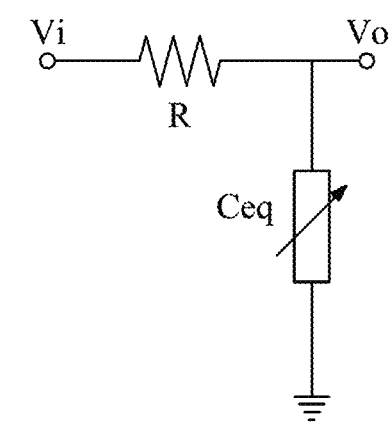
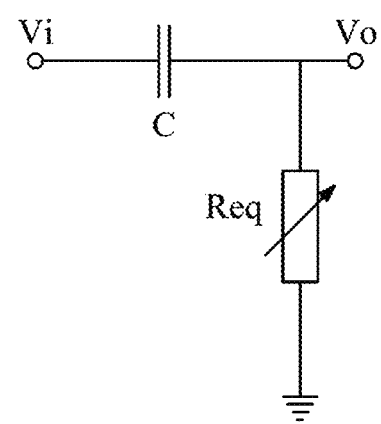
FIG. 4A      FIG. 4B      FIG. 4C

ACTIVE INDUCTIVE SIMULATOR AND IMPEDANCE MULTIPLIER

CROSS-REFERENCE TO RELATED APPLICATIONS

The present application is a Continuation of U.S. application Ser. No. 17/901,434, now allowed, having a filing date of Sep. 1, 2022.

STATEMENT OF ACKNOWLEDGEMENT

The inventors acknowledge the support provided by the King Fahd University of Petroleum and Minerals (KFUPM), Riyadh, Saudi Arabia.

BACKGROUND

Technical Field

The present disclosure is directed to a tunable grounded positive and negative active inductor simulator and impedance multiplier.

Description of Related Art

The "background" description provided herein is for the purpose of generally presenting the context of the disclosure. Work of the presently named inventors, to the extent it is described in this background section, as well as aspects of the description which may not otherwise qualify as prior art at the time of filing, are neither expressly or impliedly admitted as prior art against the present invention.

Tunable filters are used in electronic systems to control receiving or transmitting frequencies to lie within a frequency range. In the tunable filters, an operating frequency can be tuned in a controlled manner, thereby providing flexibility for use in different applications. Tunable filters are used in a number of different applications including but not limited to, base stations, mobile devices, instrumentation, industrial electronics, military electronics, laptop computers, tablets, digital radios, and compact and/or portable instruments.

Simulated inductor and impedance scaling circuits are used in designing devices such as active filters, oscillators, phase shifters, and the like. The advantages of the simulated inductor include integration, low area, and high quality factor. A capacitance multiplier also finds wide applications in capacitive interfaces and other analog circuits requiring large value capacitors. Recent advancements in CMOS technology allow integration of different types of circuits into a single chip, reducing the device's size and weight. For a linear integrated circuit, the basic physical circuit elements include resistors, capacitors, and transistors. In modern circuit analysis and synthesis, a current conveyor (CCII) is a universal functional circuit element. The current conveyor can provide better gain-bandwidth products than comparable operational amplifiers under both small and large signal conditions. However, a CCII (also known as a current-mode active building block) lacks a low-impedance voltage output port and does not provide an output signal in a voltage form. Thus CCII requires an extra voltage buffer at the output.

A new active building block (ABB) called a second generation voltage conveyor (VCII) is being used in many analog signal processing applications. Like CCII, the operation of VCII is based on current-mode signal processing. The VCII offers most of the advantages provided by CCII. The VCII has a low impedance voltage output port, a low impedance current input terminal, and a high impedance current output terminal, which offers more flexibility in applications such as various types of filters. The VCII is useful in different circuits, such as impedance simulators, filters, rectifiers, oscillators, and the like. There are various types of simulated inductors available in the industry. Most commercially available inductor simulators, for example, use a large number of elements, such as floating capacitors and commercially available ICs. For example, a conventional VCII-based simulated grounded inductor uses a plus type VCII (VCII+) and a negative type VCII (VCII−) in addition to three passive components to realize an active inductor. Furthermore, conventional voltage conveyor circuits are not suitable for being used over a wide frequency range.

Accordingly, it is one object of the present disclosure to provide a tunable impedance simulator and impedance multiplier circuit using a single VCII which is capable of being used in different frequency ranges.

SUMMARY

In an exemplary embodiment a tunable grounded positive and negative active inductor simulator and impedance multiplier circuit is described. The circuit includes one second generation voltage-mode conveyor circuit (VCII+), configured with a positive VCII+ input terminal Y, a first output terminal Z and a second output terminal X, wherein the VCII+ has a current gain $\beta$, and a voltage gain $\alpha$, a voltage source $V_s$ configured to generate an output current at a frequency s, a first impedance $Z_1$ connected between the voltage source and the positive VCII+ input terminal Y wherein an internal circuit of the first impedance $Z_1$ comprises a resistor $R_1$ in parallel with a capacitor $C_1$, a second impedance $Z_2$ connected between the second output terminal X and a ground terminal, wherein an internal circuit of the second impedance $Z_2$ comprises a resistor $R_2$ in parallel with a capacitor $C_2$, and an operational transconductance amplifier OTA configured to have a transconductance gain $g_m$, wherein the OTA includes a positive OTA input terminal, a negative OTA input terminal, an OTA output terminal, and a current bias $I_B$ input terminal, wherein: the positive OTA input terminal is connected to one of the first output terminal Z and the ground terminal, the negative OTA input terminal is connected to one of the first output terminal Z and the ground terminal, and the OTA output terminal is connected to the first impedance $Z_1$, wherein the grounded positive and negative active inductor simulator and impedance multiplier circuit is configured to be tunable by a selection of a value for $R_1$, a value for $C_1$, a value for $R_2$ and a value for $C_2$.

In another exemplary embodiment, a method for implementing a tunable grounded positive and negative active inductor simulator and impedance multiplier circuit is described. The method includes selecting one second generation voltage-mode conveyor circuit VCII+ configured with a positive VCII+ input terminal Y, a first output terminal Z, and a second output terminal X, wherein the VCII+ has a current gain $\beta$; and a voltage gain $\alpha$. The method includes connecting a first impedance $Z_1$ to the positive VCII+ input terminal Y, wherein an internal circuit of the first impedance $Z_1$ comprises a resistor $R_1$ in parallel with a capacitor $C_1$. The method further includes connecting a voltage source $V_s$ to the first impedance $Z_1$, wherein the voltage source $V_s$ is configured to generate an output current at a frequency, s. The method further includes connecting a second impedance $Z_2$ between the second output terminal X and a ground terminal. The method further includes selecting one operational transconductance amplifier OTA configured to have a transconductance gain $g_m$, wherein the OTA includes a positive OTA input terminal, a negative OTA input terminal, and an OTA output terminal. The method further includes connecting the positive OTA input terminal to one of the first output terminal Z, and the ground terminal. The method further includes connecting the negative OTA input terminal to one of the first output terminal Z and the ground terminal. The method further includes connecting the OTA output terminal to the first impedance $Z_1$ such that: the OTA is configured to generate an output current $I_o$, the positive VCII+ input terminal is configured to receive an input current $I_y$ equal to the difference between $I_s$ and $I_0$, the first output terminal Z is configured to generate a voltage $V_z$, the second output terminal X is configured to generate a voltage $V_x$ across the second impedance $Z_2$ and a current ix through the second impedance $Z_2$, wherein $i_x = \pm\beta I_y$ and $V_z = \alpha V_x$, the output current $I_o$ is given by $I_o = I_x Z_2 g_m = -I_y Z_2 g_m$, and a voltage at the positive VCII+ input terminal Y is given by $V_y$, where $V_y = 0$.

In another exemplary embodiment, a system for configuring a tunable grounded positive and negative active inductor simulator and impedance multiplier circuit is described. The system includes a second generation voltage-mode conveyor circuit (VCII+), configured with a positive VCII+ input terminal Y a first output terminal Z and a second output terminal X, wherein the VCII+ has a current gain $\beta$; and a voltage gain $\alpha$ a voltage source $V_s$, configured to generate an output current at a frequency s, a first impedance $Z_1$ connected between the voltage source and the positive VCII+ input terminal Y, wherein an internal circuit of the first impedance $Z_1$ comprises a resistor $R_1$ in parallel with a capacitor $C_1$, a second impedance $Z_2$ connected between the second output terminal X and a ground terminal, wherein an internal circuit of the second impedance $Z_2$ comprises a resistor $R_2$ in parallel with a capacitor $C_2$, and an operational transconductance amplifier OTA configured to have a transconductance gain $g_m$, wherein the OTA includes a positive OTA input terminal, a negative OTA input terminal, an OTA output terminal, and a current bias $I_B$ input terminal, wherein: the positive OTA input terminal is connected to one of the first output terminal Z and the ground terminal, the negative OTA input terminal is connected to one of the first output terminal Z and the ground terminal, and the OTA output terminal is connected to the first impedance $Z_1$, wherein the grounded positive and negative active inductor simulator and impedance multiplier circuit is configured to be tunable by a selection of a value for $R_1$, a value for $C_1$, a value for $R_2$ and a value for $C_2$. The OTA is configured to generate an output current $I_o$. The positive VCII+ input terminal is configured to receive an input current $I_y$ equal to the difference between $I_s$ and $I_0$. The first output terminal Z is configured to generate a voltage $V_z$. The second output terminal X is configured to generate a voltage $V_x$ across the second impedance $Z_2$ and a current ix through the second impedance $Z_2$, wherein $i_x = \pm\beta I_y$ and $V_z = \alpha V_x$. The output current $I_o$ is given by $I_o = I_x Z_2 g_m = -I_y Z_2 g_m$, and a voltage at the positive VCII+ input terminal Y is given by $V_y$, where $V_y = 0$. The positive OTA input terminal is connected to the first output terminal Z and the negative OTA input terminal is connected to the ground terminal, an input impedance $Z_{in}$ of the VCII+ is given by $$Z_{in} = \frac{Z_1}{1 + Z_2 g_m},$$

where $Z_2 g_m$ is $\leq 1$. The system is configured to implement any one of: a tunable positive active inductor simulator by setting $Z_1 = R_1$, $C_1 = 0$, $R_2 = 0$ and $Z_2 = 1/sC_2$, such that the input impedance is given by $$Z_{in} = sC_2 \frac{R_1}{20 \times I_B} = sL$$

where $$L = C_2 \frac{R_1}{20 \times I_B},$$

and a value of the inductor L is tuned by the selection of the value of $C_2$ and the value of $R_1$, a tunable positive capacitance multiplier by setting $Z_1 = 1/sC_1$, $R_1 = 0$, $Z_2 = R_2$, and $C_2 = 0$, such that the input impedance is given by $$Z_{in} = \frac{1}{sC_1(1 + 20 \times R_2 I_B)},$$

in which the capacitance $C_1$ is multiplied by $(1 + 20 \times R_2 I_B)$, wherein an amount of multiplication of $C_1$ is tuned by the selection of the value of $R_2$, and a tunable positive resistance multiplier by setting $Z_1 = R_1$, $C_1 = 0$, $Z_2 = R_2$, $C_2 = 0$, such that the input impedance is given by $$Z_{in} = \frac{R_1}{(1 - 20 \times R_2 I_B)},$$

in which $R_1$ is multiplied by $$\frac{1}{(1 - 20 \times R_2 I_B)},$$

where $0 \leq 20 \times R_2 I_B < 1$, wherein an amount of multiplication of $R_1$ is tuned by the selection of the value of $R_2$; and when the positive OTA input terminal is connected to the ground terminal, the negative OTA input terminal is connected to the first output terminal Z such that an input impedance $Z_{in}$ of the VCII+ is given by $$Z_{in} = \frac{Z_1}{1 + Z_2 g_m},$$

where $Z_2 g_m > 1$, the system is configured to implement any one of: a tunable negative active inductor simulator by setting $Z_1 = R_1$, $C_1 = 0$, $R_2 = 0$ and $Z_2 = 1/sC_2$, such that the input impedance is given $$Z_{in} = -sC_2 \frac{R_1}{20 \times I_B} = -sL$$

where $$L = C_2 \frac{R_1}{20 \times I_B},$$

wherein a value of the inductor L is tuned by the selection of the value of $C_2$ and the value of $R_1$, a tunable negative active capacitance multiplier by setting $Z_1=1/sC_1$, $R_1=0$, $Z_2=R_2$, and $C_2=0$, such that the input impedance is given $$Z_{in} = -\frac{1}{sC_1(1 + 20 \times R_2 I_B)},$$

in which the capacitance $C_1$ is multiplied by $(20 \times R_2 I_B)$, wherein an amount of multiplication of $C_1$ is tuned by the selection of the value of $R_2$, and a tunable negative resistance multiplier by setting $Z_1=R_1$, $C_1=0$, $Z_2=R_2$, $C_2=0$, such that the input impedance is given $$Z_{in} = -\frac{R_1}{(1 - 20 \times R_2 I_B)},$$

in which $R_1$ is multiplied by $$-\frac{1}{(1 - 20 \times R_2 I_B)},$$

where $0 \leq 20 \times R_2 I_B < 1$, wherein an amount of multiplication of $R_1$ is tuned by the selection of the value of $R_2$.

The foregoing general description of the illustrative embodiments and the following detailed description thereof are merely exemplary aspects of the teachings of this disclosure, and are not restrictive.

BRIEF DESCRIPTION OF THE DRAWINGS

A more complete appreciation of this disclosure and many of the attendant advantages thereof will be readily obtained as the same becomes better understood by reference to the following detailed description when considered in connection with the accompanying drawings, wherein:

FIG. 3 is a schematic diagram illustrating an exemplary configuration of a tunable grounded negative active inductor simulator and resistance multiplier circuit, according to aspects of the present disclosure;

FIG. 4A illustrates a circuit diagram of a high pass filter (HPF) based on an active inductor simulator, according to aspects of the present disclosure;

FIG. 4B illustrates a circuit diagram of a low pass filter (LPF) based on a capacitance multiplier, according to aspects of the present disclosure;

FIG. 4C illustrates a circuit diagram of the HPF based on a resistance multiplier, according to aspects of the present disclosure;

DETAILED DESCRIPTION

Figure 1:
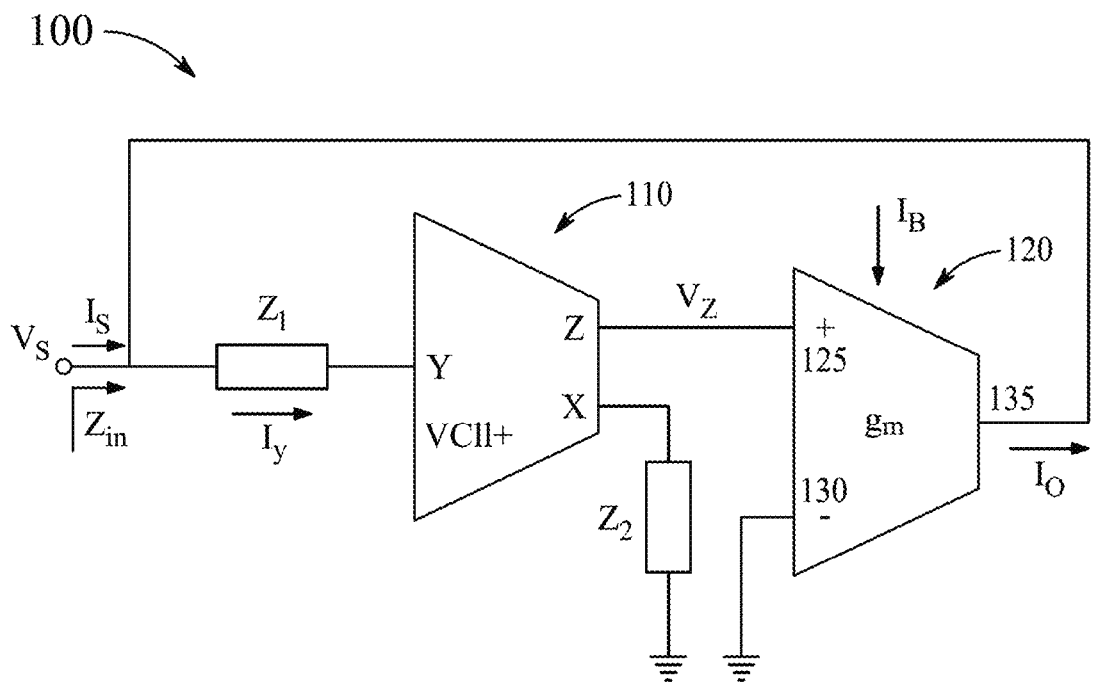
FIG. 1 is a high-level diagram illustrating an exemplary configuration of a tunable grounded positive and negative active inductor simulator and impedance multiplier circuit, according to aspects of the present disclosure.

In the drawings, like reference numerals designate identical or corresponding parts throughout the several views. Further, as used herein, the words "a," "an" and the like generally carry a meaning of "one or more," unless stated otherwise.

Furthermore, the terms "approximately," "approximate," "about," and similar terms generally refer to ranges that include the identified value within a margin of 20%, 10%, or preferably 5%, and any values therebetween.

Aspects of this disclosure are directed to a grounded positive and negative active inductor simulator (AIS) and impedance multiplier circuit. The grounded positive and negative active inductor simulator and impedance multiplier circuit can be configured as any one of an active inductor simulator, a capacitance multiplier, a positive resistance multiplier, a negative resistance multiplier, a negative active inductor simulator, and a negative capacitance multiplier by choosing the values of $Z_1$ and $Z_2$. The described circuit includes only one second-generation voltage-mode conveyor (VCII+), one transconductance amplifier, OTA, and two passive elements.

In various aspects of the disclosure, non-limiting definitions of one or more terms that are used in the document are provided below.

The term "second-generation voltage-mode conveyor (VCII)" is defined as a dual circuit of a second-generation current conveyor (CCII), which provides the possibility of processing signals in the current domain while providing output signals in the voltage form. The VCII includes Y and X ports (input terminals) and Z port (output terminal). Y is a low-impedance current input port and X is a high-impedance current output port. For VCII, B is a current gain between the Y and X ports and α is a voltage gain between the X and Z ports. $V_x$ and $V_z$ are the voltages at the X and Z ports, respectively. $I_y$ and $I_x$ are the input current to the Y port and output current at the X port, respectively.

The term "plus type VCII (VCII+)" is defined as a second-generation voltage-mode conveyor (VCII) in which current in the X terminal flows in the same direction with respect to that related to the Y terminal. The VCII+ has +β (positive current gain).

The term "negative type VCII (VCII−)" is defined as a second-generation voltage-mode conveyor (VCII) in which current in the X terminal. The VCII− has −β (positive current gain).

The term "impedance simulator" is defined as a circuit that simulates an input impedance that may be one of inductive, capacitive and active (resistance). The impedance simulator is used for simulating the impedance of an electronic equipment under different power consumption platforms.

The term "capacitance multiplier" is defined as an electronic circuit that increases the value of a reference capacitor by a predefined multiplication factor, achieving a higher equivalent capacitance level in an IC form. The capacitor multipliers support design of complex integrated circuits possible that otherwise would be challenging with actual capacitors.

The term "impedance multiplier" is defined as a circuit that effectively magnifies the impedance presented by an external load. An example of impedance multiplier is an "impedance doubler", which doubles the effective impedance of the external load. The impedance multiplier circuit includes an input impedance having a defined value of impedance and a circuit coupled to this input impedance for multiplying its value by a multiplication factor.

FIG. 1 is a high-level diagram illustrating an exemplary configuration of a tunable grounded positive and negative active inductor simulator and impedance multiplier circuit 100 (hereinafter referred to as the "circuit 100"). Referring to FIG. 1, the circuit 100 includes a second generation voltage-mode conveyor circuit (VCII+) 110, a voltage source $V_s$, an operational transconductance amplifier (OTA) 120 and two passive components: a first impedance $Z_1$, and a second impedance $Z_2$.

The second generation voltage-mode conveyor circuit (VCII+) 110 includes a positive VCII+ input terminal Y, a first output terminal Z, and a second output terminal X. In an aspect, the VCII+ 110 has a current gain β, and a voltage gain α. The voltage source $V_s$ is configured to generate an output current $I_s$ at a frequency s.

The first impedance $Z_1$ is electrically connected between the voltage source $V_s$ and the positive VCII+ input terminal Y. An internal circuit of the first impedance $Z_1$ includes a resistor $R_1$ and a capacitor $C_1$, where the resistor $R_1$ is connected in parallel to the capacitor $C_1$.

The second impedance $Z_2$ is electrically connected between the second output terminal X, and a ground terminal. An internal circuit of the second impedance $Z_2$ has a resistor $R_2$ and a capacitor $C_2$, where the resistor $R_2$ is connected in parallel to the capacitor $C_2$.

The operational transconductance amplifier (OTA) 120 is an amplifier whose differential input voltage produces an output current. For example, the OTA 120 is a voltage controlled current source (VCCS). In an aspect, the OTA 120 includes an additional input for a current to control a transconductance of the OTA 120. In an example, the OTA 120 has a transconductance gain $g_m$. The OTA 120 includes a positive OTA input terminal 125, a negative OTA input terminal 130, an OTA output terminal 135, and a current bias $I_B$ input terminal. In an aspect, the positive OTA input terminal 125 is connected to one of the first output terminal Z and the ground terminal. The negative OTA input terminal 130 is connected to one of the first output terminal Z and the ground terminal. The OTA output terminal 135 is connected to the first impedance $Z_1$.

In an aspect, the grounded positive and negative active inductor simulator and impedance multiplier circuit 100 is configured to be tuned by a selection of a value for $R_1$, a value for $C_1$, a value for $R_2$ and a value for $C_2$.

In an aspect, the OTA 120 is configured to generate an output current $I_o$. In an example, the output current $I_o$ is given by $I_o = I_x Z_2 g_m = -I_y Z_2 g_m$. The positive VCII+ input terminal Y is configured to receive an input current $I_y$. In an example, the $I_y$ is equal to the difference between $I_s$ and $I_0$. A voltage at the positive VCII+ input terminal Y is given by $V_y$, where $V_y = 0$. The first output terminal Z is configured to generate a voltage $V_z$. The second output terminal X is configured to generate a voltage $V_x$ across the second impedance $Z_2$. The second output terminal X is configured to generate a current ix through the second impedance, $Z_2$, wherein $i_x = \pm \beta I_y$ and $V_z = \alpha V_x$.

In one example configuration, the positive OTA input terminal 125 is electrically connected to the first output terminal Z, and the negative OTA input terminal 130 is connected to the ground terminal. In such configuration, an input impedance $Z_{in}$ of the VCII+ 110 is given by $$Z_{in} = \frac{Z_1}{1 + Z_2 g_m},$$

where $Z_2 g_m$ is ≤1.

In an aspect, the circuit 100 is configured to operate as a tunable positive active inductor simulator by setting $Z_1 = R_1$, $C_1 = 0$, $R_2 = 0$ and $Z_2 = 1/sC_2$, such that the input impedance is given by $$Z_{in} = sC_2 \frac{R_1}{20 \times I_B} = sL$$

where $$L = C_2 \frac{R_1}{20 \times I_B}.$$

In an aspect, a value of the inductor L can be tuned by the selection of the value of $C_2$ and the value of $R_1$.

In an aspect, the circuit 100 is configured to operate as a tunable positive capacitance multiplier by setting $Z_1 = 1/sC_1$, $R_1 = 0$, $Z_2 = R_2$, and $C_2 = 0$, such that the input impedance is given by $$Z_{in} = \frac{1}{sC_1(1 + 20 \times R_2 I_B)},$$

in which the capacitance $C_1$ is multiplied by $(1 + 20 \times R_2 I_B)$. In an aspect, an amount of multiplication of $C_1$ is tuned by the selection of the value of $R_2$.

In an aspect, the circuit 100 is configured to operate as a tunable positive resistance multiplier by setting $Z_1 = R_1$, $C_1 = 0$, $Z_2 = R_2$, $C_2 = 0$, such that the input impedance is given by $$Z_{in} = \frac{R_1}{(1-20 \times R_2 I_B)},$$

in which $R_1$ is multiplied by $$\frac{1}{(1-20 \times R_2 I_B)},$$

where $0 \leq 20 \times R_2 I_B < 1$. In an aspect, an amount of multiplication of $R_1$ is tuned by the selection of the value of $R_2$.

In one example configuration, the positive OTA input terminal 125 is connected to the ground terminal. The negative OTA input terminal 130 is connected to the first output terminal Z. The input impedance $Z_{in}$ of the VCII+ is given by $$Z_{in} = \frac{Z_1}{1+Z_2 g_m},$$

where $Z_2 g_m > 1$.

In an aspect, the circuit 100 is configured to operate as a tunable negative active inductor simulator by setting $Z_1 = R_1$, $C_1 = 0$, $R_2 = 0$ and $Z_2 = 1/sC_2$, such that the input impedance is given by $$Z_{in} = -sC_2 \frac{R_1}{20 \times I_B} = -sL$$

where $$L = C_2 \frac{R_1}{20 \times I_B}.$$

In an aspect, a value of the inductor L is tuned by the selection of the value of $C_2$ and the value of $R_1$.

In an aspect, the circuit 100 is configured to operate as a tunable negative active capacitance multiplier is configured by setting $Z_1 = 1/sC_1$, $R_1 = 0$, $Z_2 = R_2$, and $C_2 = 0$, such that the input impedance is given by $$Z_{in} = -\frac{1}{sC_1(1+20 \times R_2 I_B)},$$

in which the capacitance, $C_1$, is multiplied by $(20 \times R_2 I_B)$. In an aspect, an amount of multiplication of $C_1$ is tuned by the selection of the value of $R_2$.

In an aspect, the circuit 100 is configured to operate as a tunable negative resistance multiplier by setting $Z_1 = R_1$, $C_1 = 0$, $Z_2 = R_2$, and $C_2 = 0$, such that the input impedance is given by $$Z_{in} = -\frac{R_1}{(1-20 \times R_2 I_B)},$$

in which $R_1$ is multiplied by $$-\frac{1}{(1-20 \times R_2 I_B)},$$

where $0 \leq 20 \times R_2 I_B < 1$. In an aspect, an amount of multiplication of $R_1$ is tuned by the selection of the value of $R_2$.

A relationship between voltage and currents terminals of VCII+ 110 is represented as:

$$i_x = \pm \beta i_y, \quad V_z = \alpha V_x, \quad V_y = 0, \quad (1)$$

where $\beta$ is a current gain and $\alpha$ is a voltage gain.

The terminal characteristics of the VCII+ 110 are high impedance at X node (input terminal) and low impedance at Y and Z nodes (output terminals).

With reference to FIG. 1, the input impedance of the circuit 100 is given by:

$$Z_{in} = \frac{V_s}{I_s} = \frac{V_s}{I_y - I_o}, \quad (2)$$

$$i_0 = V_Z \times g_m = i_x Z_2 g_m = -i_y Z_2 g_m. \quad (3)$$

As, $i_y = V_s/Z_1$, the input impedance is given as:

$$Z_{in} = \frac{Z_1}{1+Z_2 g_m},$$

where, $g_m = 20 \times I_B$ is the OTA transconductance and $I_B$ is the OTA bias current.

From equation (4), the circuit 100 can be used to implement the tunable grounded active inductor and capacitance multiplier as follows:

I. Implementation as the Active Inductor Simulator (AIS)
If $Z_1 = R_1$, and $$Z_2 = \frac{1}{sC_2},$$

the input impedance is given by:

$$Z_{in} = sC_2 \frac{R_1}{20 \times I_B} = sL, \quad (5)$$

where $$L = C_2 \frac{R_1}{20 \times I_B}.$$

Equation (5) implements the tunable AIS, and the value of the inductance is controlled using $R_1$ and $I_B$.

II. Implementation as the Capacitance Multiplier
If $$Z_1 = \frac{1}{sC_1}$$

and $Z_2=R_2$, then the input impedance is given by:

$$Z_{in} = \frac{1}{sC_1(1+20\times R_2 I_B)}. \quad (6)$$

The original capacitance ($C_1$) is multiplied by ($1+20\times R_2 I_B$) and can be tuned using $R_2$ and $I_B$.

Figure 2:
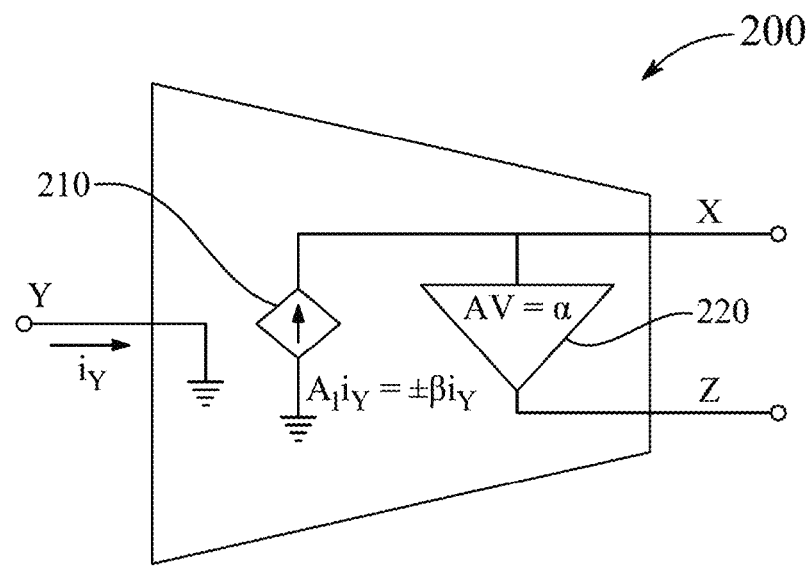
FIG. 2 is an exemplary internal structure of a voltage-mode conveyor, according to aspects of the present disclosure.

FIG. 2 is an internal structure of a voltage-mode conveyor 200, according to aspects of the present disclosure. For example, the voltage-mode conveyor 200 is a second-generation voltage conveyor (VCII). The VCII 200 includes a current buffer 210 and a voltage buffer 220. The current buffer 210 is set up between the Y and X terminals, and the voltage buffer 220 set up between the X and Z terminals. Unlike a CCII, the Y terminal of the VCII 200 is a low impedance current input port with an ideal value of zero, X is a high impedance current output port (terminal) with an ideal value of infinite, and Z is a low impedance voltage output port with an ideal value of zero. The relationship between port voltages and currents is expressed as:

$$\begin{bmatrix} i_x \\ V_z \end{bmatrix} = \begin{bmatrix} \pm\beta & 0 \\ 0 & \alpha \end{bmatrix} \begin{bmatrix} i_y \\ V_x \end{bmatrix} \quad (7)$$

where VCII+ and VCII− are identified by +β and −β, respectively (where β should be close to 1). For example, a VCII can act as a positive VCII+ and a negative VCII−. The function of the VCII is either positive or negative based on whether a current in the X terminal flows in the same direction (positive, VCII+) or in the opposite direction (negative, VCII−) with respect to that related to the Y terminal.

The voltage gain of the voltage buffer 220 is α (AV=α). In an example, the value of a is unity. As the Y terminal has an extremely low input impedance, the Y terminal can be considered as a virtual ground node. The main features of VCII 200 can be summarized as firstly, unlike other active blocks, a current summing operation can be easily performed at the current input low impedance Y port. Secondly, having a low impedance voltage output Z port allows the employment of the VCII 200 in a voltage mode workflow, giving the flexibility to easily perform current mode operations to the designer. Thirdly, positive and negative voltage gains are simply obtained by employing a VCII+ and a VCII−, respectively.

FIG. 3 is a schematic diagram illustrating an exemplary configuration of a tunable grounded negative active inductor simulator and resistance multiplier circuit 300 (hereinafter referred to as "the circuit 300"). For example, the circuit 300 can be configured to implement any one of a tunable positive resistance multiplier, a tunable negative resistance multiplier, a negative active inductor simulator and a negative capacitance multiplier. Referring to FIG. 3, the circuit 300 includes a second generation voltage-mode conveyor circuit (VCII+) 310, a voltage source $V_s$, a first impedance $Z_1$, a second impedance $Z_2$, and an operational transconductance amplifier (OTA) 320. The construction of circuit 300 is substantially similar to that of the circuit 100, and thus the construction is not repeated here in detail for the sake of brevity.

With reference to FIG. 3, the input impedance $Z_{in}$ is given by:

$$Z_{in} = \frac{Z_1}{1-Z_2 g_m}. \quad (8)$$

I. Implementation as a Positive Resistance Multiplier

From Equation 8, if $Z_2 g_m<1$, then $Z_1$ will be scaled up and if $Z_1=R_1$ (the resistance to be scaled up), $Z_2=R_2$, then the input impedance is given by:

$$Z_{in} = \frac{R_1}{(1-20\times R_2 I_B)}. \quad (9)$$

In an aspect, a value of the $20\times R_2 I_B$ lies between 0 and 1.

II. Implementation as a Negative Resistance Multiplier

From Equation 8, if $Z_2 g_m>1$, then a negative tunable resistance multiplier is obtained.

If $Z_1=R_1$ (the resistance to be scaled up), $Z_2=R_2$, then the input impedance is given by:

$$Z_{in} = \frac{R_1}{(-20\times R_2 I_B)}. \quad (10)$$

III. Implementation as a Negative Active Inductor Simulator

If $Z_1=R_1$ and, $$Z_2 = \frac{1}{sC_2},$$

$Z_2=g_m>1$, then a negative active inductor is obtained and is given by:

$$Z_{in} = -sC_2 \frac{R_1}{20\times I_B}. \quad (11)$$

IV. Implementation as the Negative Capacitance Multiplier

If $$Z_1 = \frac{1}{sC_1},$$

and $Z_2=R_2$, $Z_2 g_m>1$, then the input impedance is given by:

$$Z_{in} = -\frac{1}{sC_1(20\times R_2 I_B)}. \quad (12)$$

The following examples are provided to illustrate further and to facilitate the understanding of the present disclosure.

Experimental Data and Analysis

First Experiment: Determining the functionality of the tunable grounded positive and negative active inductor simulator and impedance multiplier circuit 100.

To confirm the functionality of the circuit 100, the active inductor simulator (AIS) and the capacitor multiplier were used in the design of a high pass filter (HPF) and a low pass filter (LPF) respectively. The resistance multiplier was also used in the designing of the HPF.

Experiments were performed using a multisim professional tool (developed by National Instruments, located at NI. 11500 N Mopac Expwy, Austin, TX 78759-3504, USA). The multisim tool is an industry standard SPICE simulation and circuit design software for analog, digital, and power electronics in education and research. The multisim tool integrates industry standard SPICE simulation with an interactive schematic environment to instantly visualize and analyze electronic circuit behavior. The circuit 100 was experimentally tested by using an AD844 as the VCII+ 110. The AD844 is fabricated by Analog Devices, located at One Analog Way Wilmington, MA 01887, USA. In an example, an LM13700 is used as OTA 120. The LM13700 is fabricated by Texas Instruments, located at 12500 TI Blvd., Dallas, Texas 75243, USA. In an example, the circuit 100 is powered with $V_{cc}=-V_{ss}=5V$.

FIG. 4A illustrates a circuit diagram of the HPF 410 using the AIS. An RL circuit acts as the HPF 410 as shown in FIG. 4A. In the circuit, the resistor R is a series component and the equivalent inductor $L_{eq}$ is a shunt component. For confirming the functionality of the AIS, the high pass filter circuits shown in FIG. 4A was simulated with R=1 kΩ and the active impedance parameters were $R_1=10$ kΩ, and $C_2=1$ nF.

FIG. 4B illustrates a circuit diagram of a LPF 420 based on the capacitance multiplier. The resistor R is the series component and an equivalent capacitor $C_{eq}$ is the shunt component. The resistor R is placed in series with the power source and the equivalent capacitor $C_{eq}$ is placed in parallel to that same power source. An RC circuit as shown in FIG. 4B forms the LPF 420 because of the reactive properties of the capacitor $C_{eq}$. The equivalent capacitor $C_{eq}$ offers very high resistance or impedance to low frequency signals. Conversely, the equivalent capacitor $C_{eq}$ offers lower resistance as the frequency of the signal increases. Thus, the equivalent capacitor $C_{eq}$ offers very low impedance to a very high frequency signal. As the equivalent capacitor $C_{eq}$ offers low impedance to high-frequency signals, high frequency signals normally go through the equivalent capacitor $C_{eq}$, as the equivalent capacitor $C_{eq}$ represents a low-impedance path. Thus, high-frequency signals pass via the capacitor path, while low-frequency signals do not take the capacitor path. Instead, the low-frequency signals are transmitted to output.

FIG. 4C illustrates a circuit diagram of a HPF 430 based on the resistance multiplier. Two passive elements, that is, equivalent resistor $R_{eq}$ and capacitor C are connected in series combination to allow the frequencies higher than the cut-off frequency of a signal. The output voltage is obtained across the equivalent resistor $R_{eq}$ by applying input voltage across the capacitor C.

Figure 5:
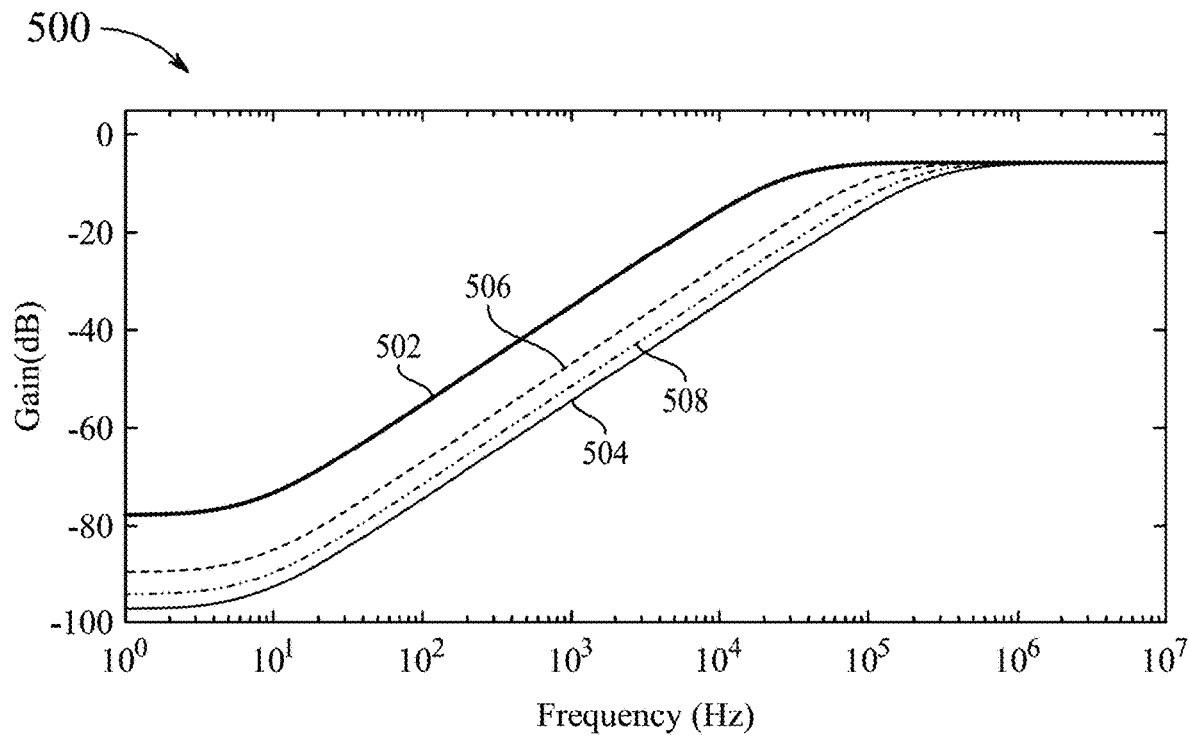
FIG. 5 illustrates a frequency response of the HPF using the active inductor simulator, according to aspects of the present disclosure.

FIG. 5 shows the frequency response 500 of the HPF 410 based on the AIS. During simulation, the value of resistance R was set to 1 kΩ. The active inductor (AI) parameters were: $R_1=10$ kΩ, and $C_2=1$ nF. The OTA bias current $I_B$ was varied from 0.2 mA to 2 mA. The inductance was varied from 0.5 mH-to-5 mH. Curve 502 represents the frequency response of the HPF 410, when value of bias current $I_B$ was 0.2 mA. Curve 504 represents the frequency response of the HPF 410, when value of bias current $I_B$ was 2 mA. Curves 506 and 508 represent the intermediate frequency response of the HPF 410. It is reflected from the FIG. 5, that the described AIS is working accurately.

Figure 6:
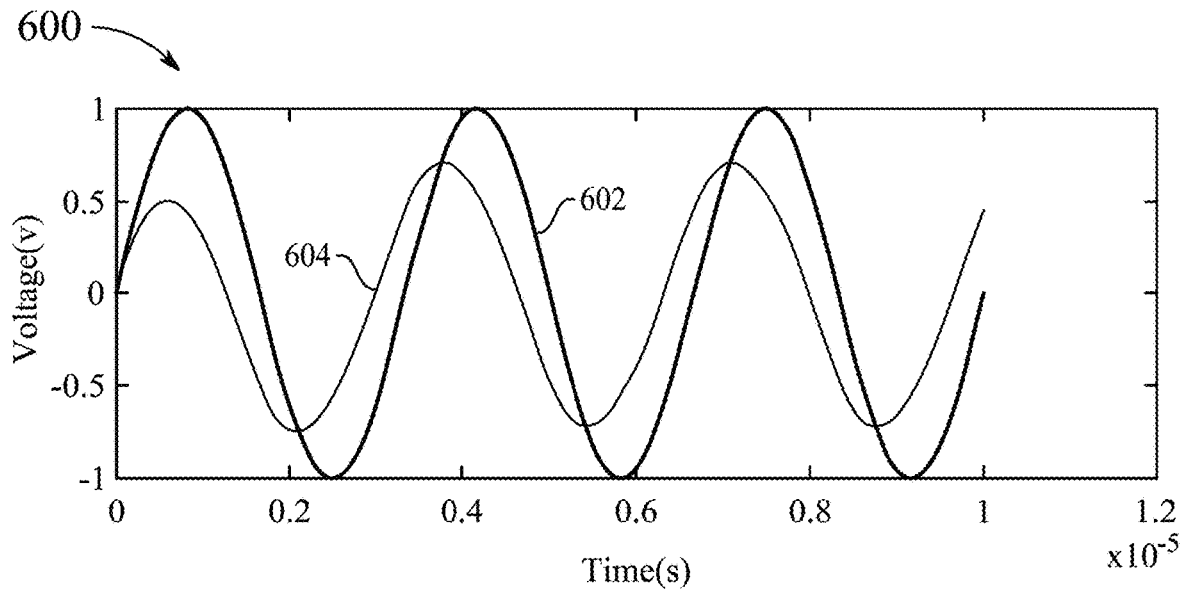
FIG. 6 illustrates a transient response of the HPF using the active inductor simulator, according to aspects of the present disclosure.

FIG. 6 shows the transient response 600 of the HPF 410 based on the AIS. As known, after an external excitation is applied, the transient response is a response of a circuit that fades out with time. The transient response is followed by a steady state response, which is the behavior of the circuit for a long time. In an example, a transient analysis of the HPF 410 was carried out using 300 kHz input signal with 1V amplitude and the bias current $I_B$ of 1 mA. Curve 602 represents an input voltage supplied to the HPF 410. Curve 604 represents an output voltage. It is reflected from the FIG. 6, that the described AIS is working accurately.

Figure 7:
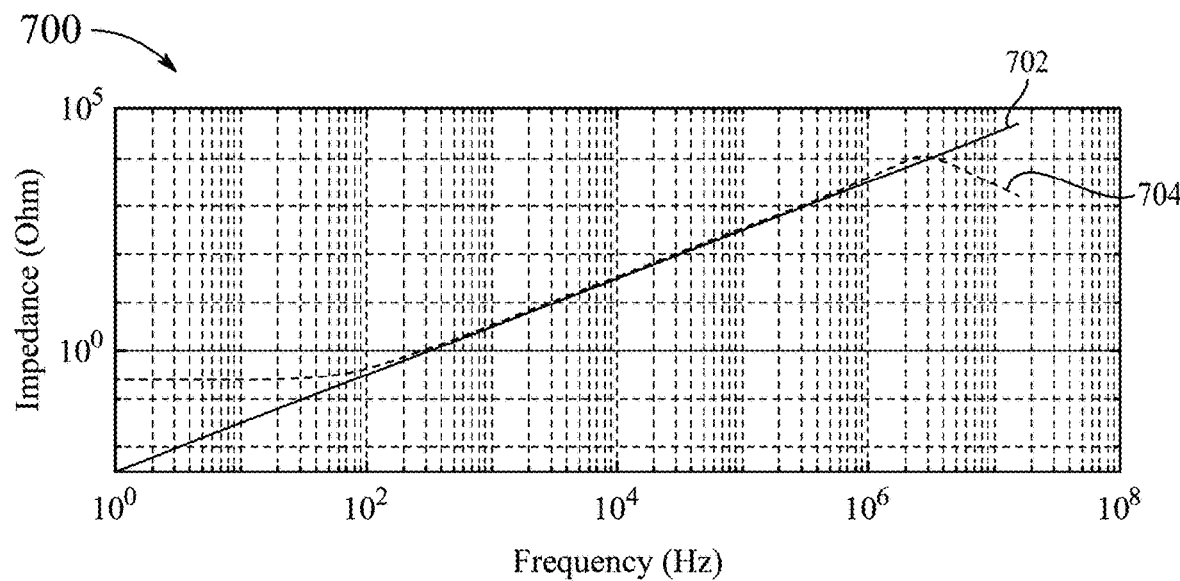
FIG. 7 shows a frequency range of the active inductor simulator, according to aspects of the present disclosure.

FIG. 7 shows a frequency range 700 of the AIS. Curve 702 represents an ideal inductance frequency response of the HPF 410. Curve 704 represents a simulated inductance frequency repose in the HPF 410. The active inductor simulator was configured to work in the range of 100 Hz to 1 MHz as shown in FIG. 7. The frequency range may be changed by varying the value of the capacitance used.

Figure 8:
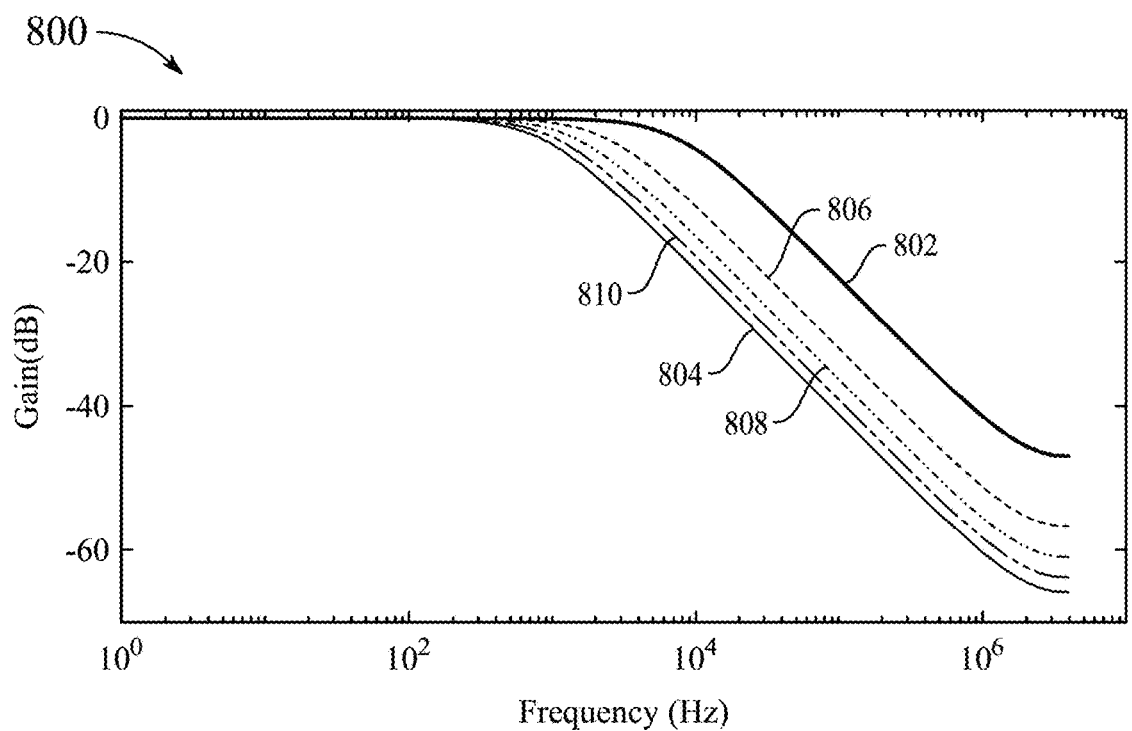
FIG. 8 illustrates a frequency response of the LPF based on the capacitance multiplier, according to aspects of the present disclosure.

FIG. 8 is an exemplary illustration 800 of the frequency response of the LPF 420 based on the capacitance multiplier. To test the functionality of the described capacitance multiplier, the described capacitance multiplier was used in the design of an RC low pass filter 420 with R=1 kΩ, $R_1=10$ kΩ and C=1 nF. The bias current $I_B$ of the OTA was varied from 0.2 mA to 2 mA. Curve 802 represents the frequency response of the LPF 420, when value of bias current $I_B$ was 0.2 mA. Curve 804 represents the frequency response of the LPF 420, when value of bias current $I_B$ was 2 mA. Curves 806 and 808 represent the intermediate frequency response of the LPF 420. FIG. 8 illustrates that the LPF 420 works properly with tunable −3 dB frequency. Curves 806, 808, and 810 represent the intermediate frequency response of the LPF 420.

Figure 9:
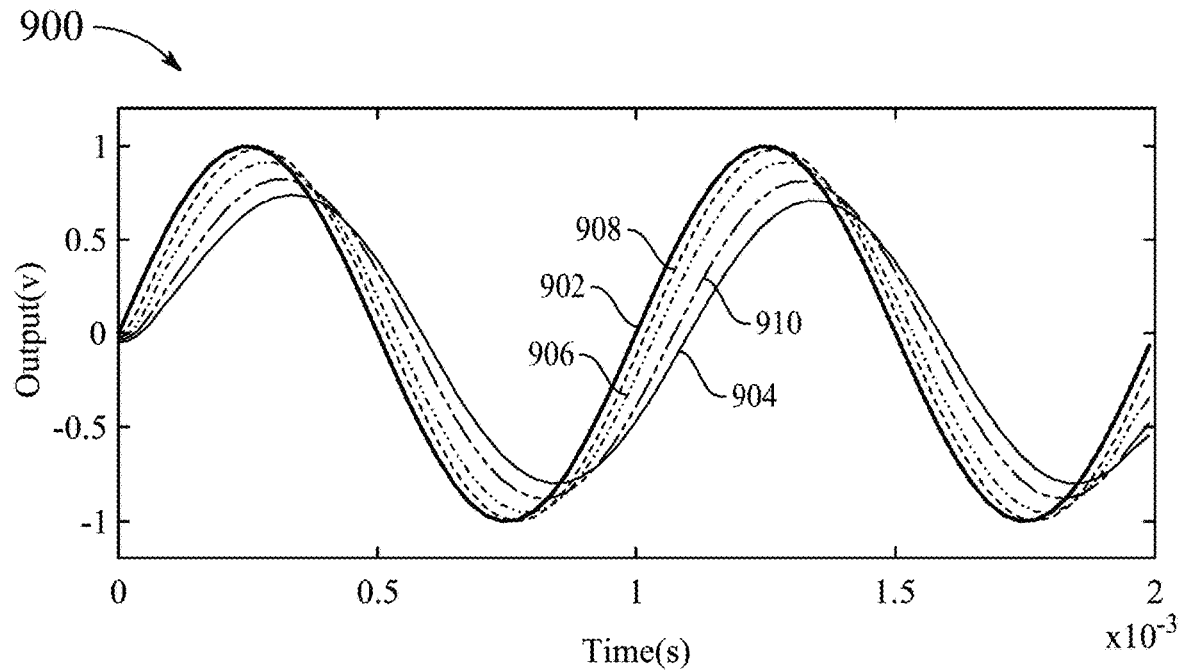
FIG. 9 illustrates a transient response of the LPF based on the capacitance multiplier, according to aspects of the present disclosure.

FIG. 9 shows the transient response 900 of the LPF 420 based on the capacitance multiplier. In an example, a transient analysis of the LPF 420 was performed. Curve 902 represents an input voltage supplied to the LPF 420. Curve 904 represents a bias current $I_B=2$ mA. FIG. 9 illustrates that the capacitance multiplier performs accurately. Curves 906, 908, and 910 represent the intermediate frequency response of the LPF 420.

Figure 10:
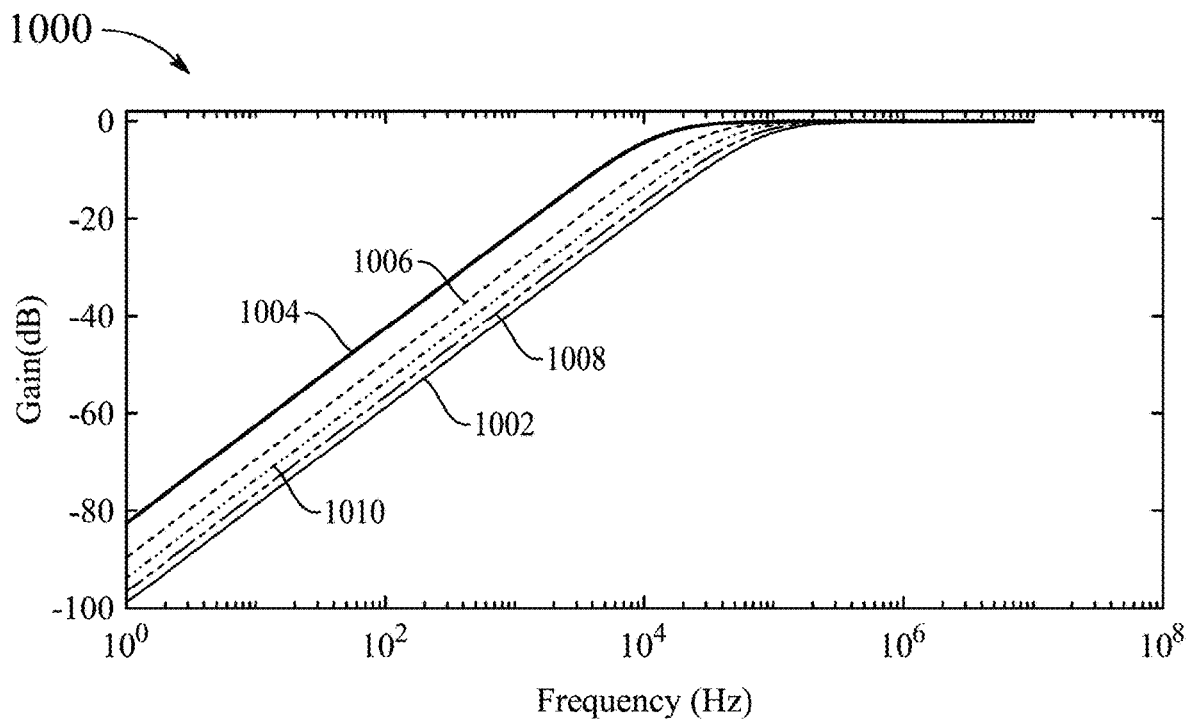
FIG. 10 illustrates a frequency response of the HPF based on the resistance multiplier, according to aspects of the present disclosure.

FIG. 10 shows the frequency response 1000 of the HPF 430 based on the resistance multiplier. To test the functionality of the described resistance multiplier, the described resistance multiplier is used in the design of an RC HPF 430. The HPF 430 has $Z_1=R_1=100Ω$, is the resistor to be scaled up and $Z_2=R_2=100Ω$ and $I_B$ can be varied such that the denominator is not zero. Curve 1002 represents the frequency response of HPF 430, when value of bias current $I_B$ was 0.2 mA. Curve 804 represents the frequency response of the HPF 430, when value of bias current $I_B$ was 2 μA. Curves 1006, 1008, and 1010 represent the intermediate frequency response of the HPF 430.

Figure 11A:
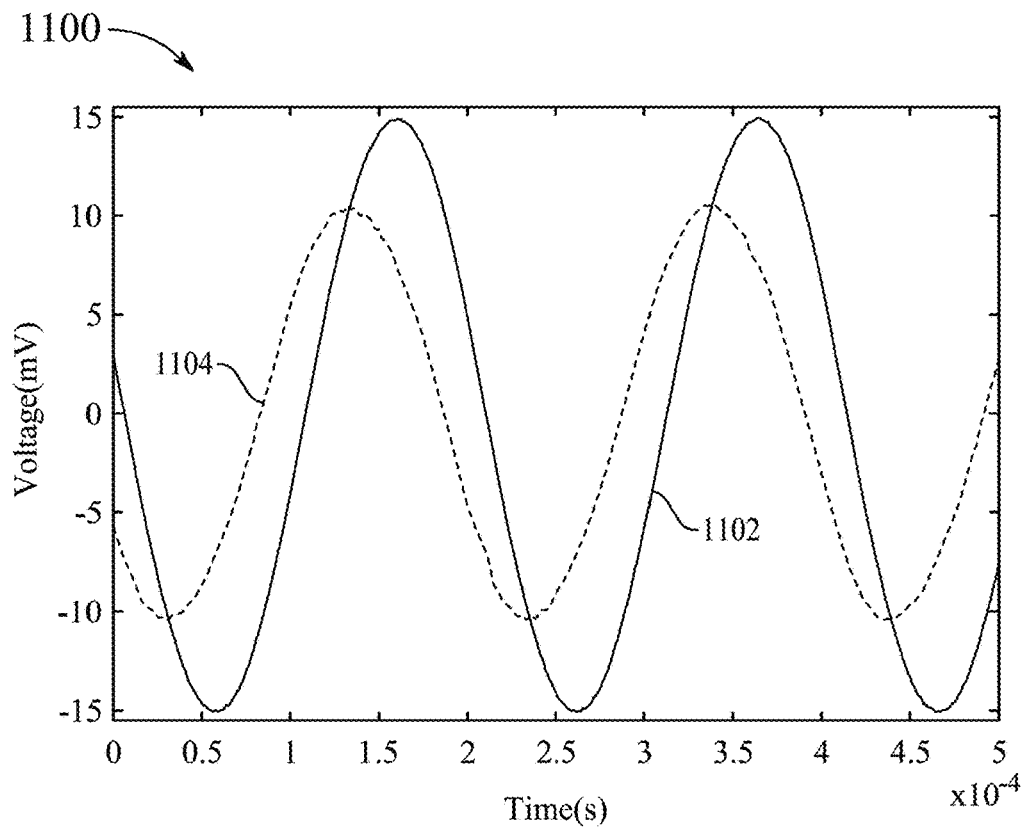
FIG. 11A illustrates the transient response of the HPF for a bias current $I_B=0.2$ mA, according to aspects of the present disclosure.
Figure 11B:
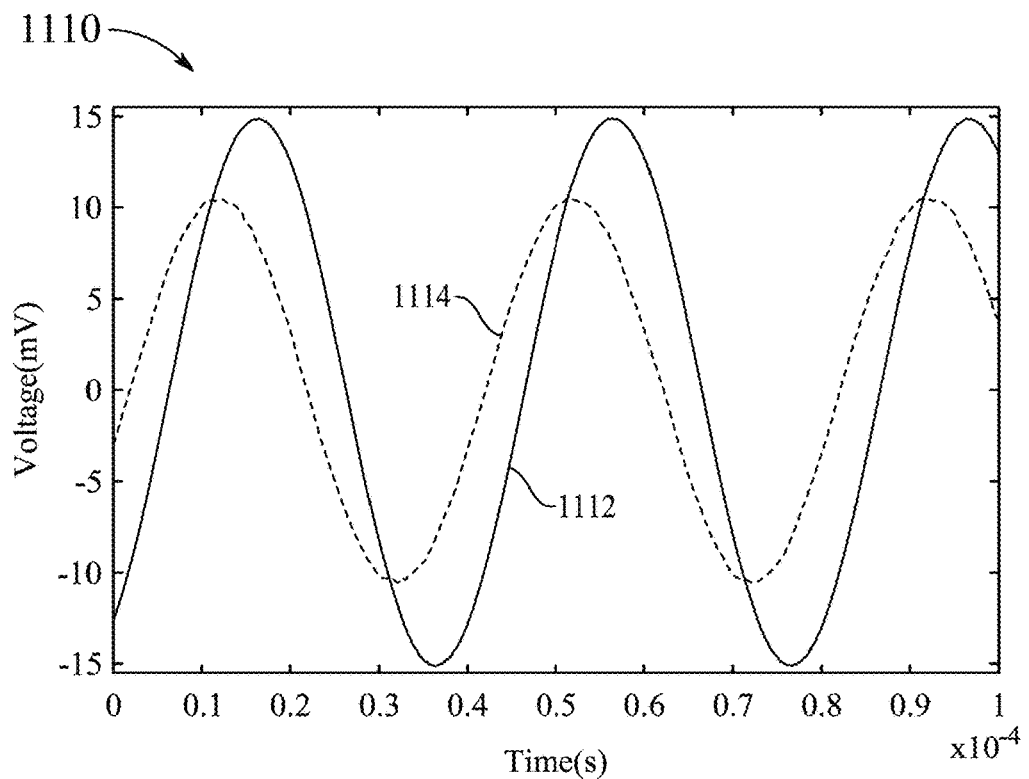
FIG. 11B illustrates the transient response of the HPF for a bias current $I_B=1$ mA, according to aspects of the present disclosure.
Figure 11C:
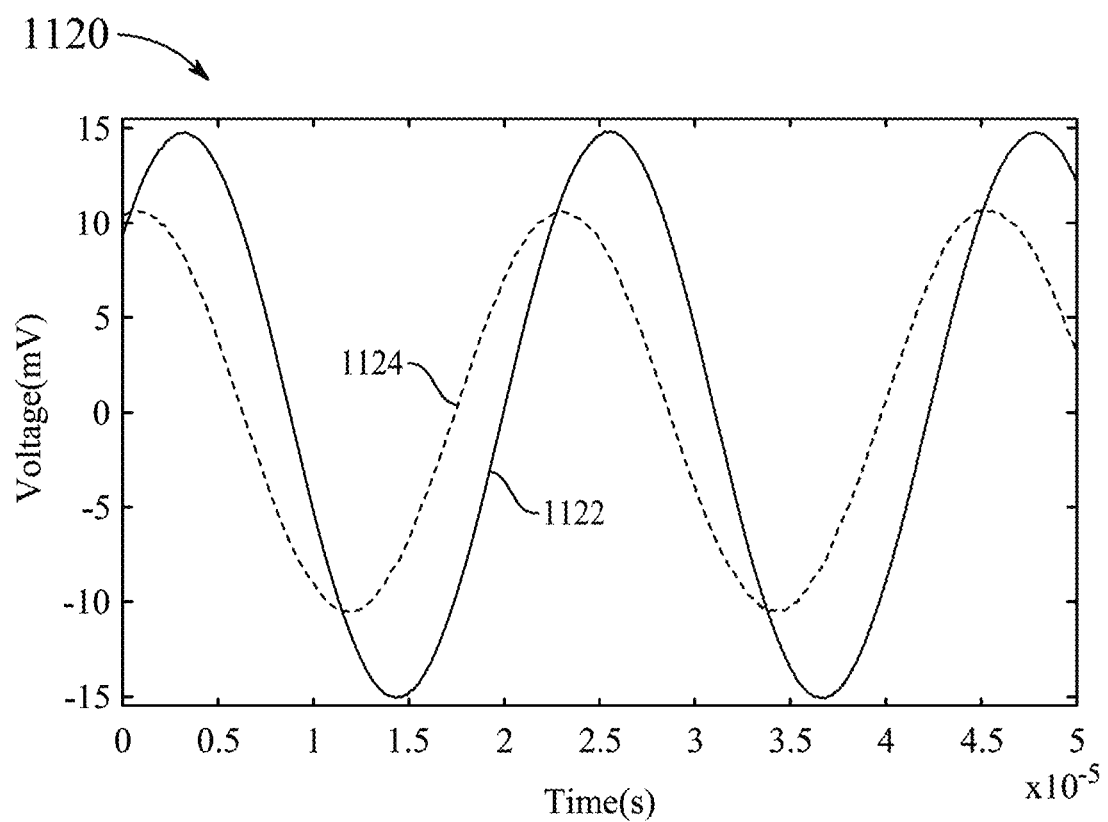
FIG. 11C illustrates the transient response of the HPF for a bias current $I_B=2$ mA, according to aspects of the present disclosure.

FIG. 11A-FIG. 11C illustrate the transient response of the HPF 410 for different bias current $I_B$. To verify the functionality of the circuit 100 experimentally, the AIS of the present disclosure was used in the design of a tunable HPF with R=1 kΩ and the active impedance parameters $R_1=10$ kΩ and $C_2=1$ nF (measured 1.2 nF). In an aspect, the transient response for different bias currents using 15 mV signal at the −3 dB frequency are shown in FIG. 11A-FIG. 11C.

FIG. 11A is an exemplary illustration 1100 of the transient response of the HPF 410 when the bias current $I_B=0.2$ mA. Curve 1102 represents the input voltage supplied to the HPF 410. Curve 1104 represents the output voltage.

FIG. 11B is an exemplary illustration 1110 of the transient response of the HPF 410 for bias current $I_B=1$ mA. Curve 1112 represents the input voltage and curve 1114 represents the output voltage.

FIG. 11C is an exemplary illustration 1120 of the transient response of the HPF 410 for bias current $I_B$=2 mA. Curve 1122 represents the input voltage and curve 1124 represents the output voltage.

Figure 12A:
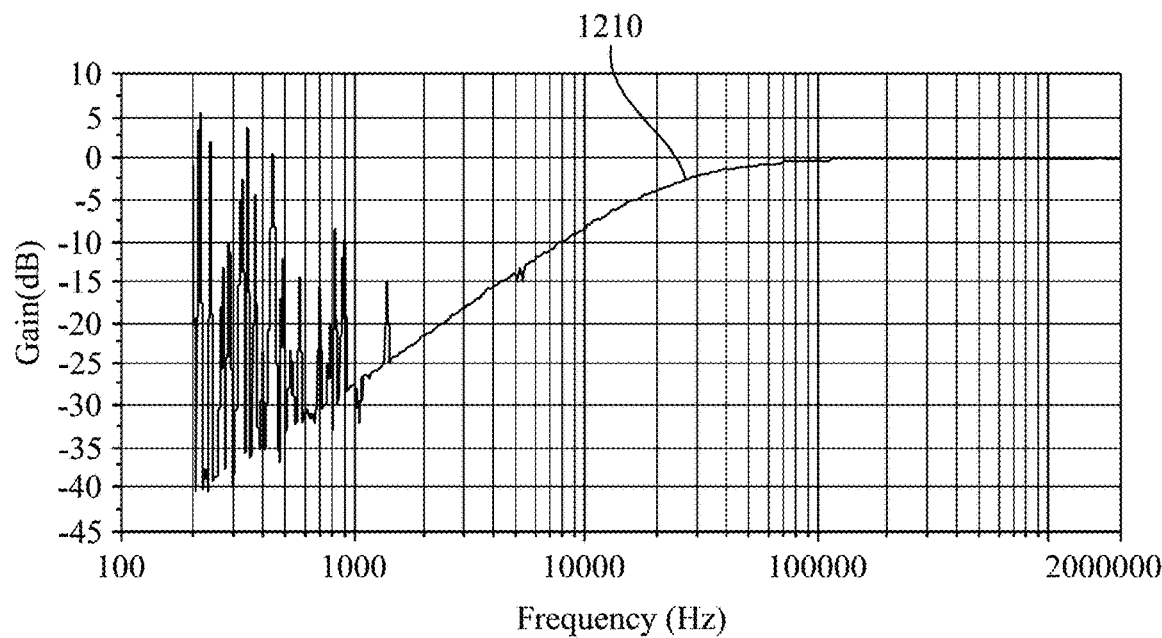
FIG. 12A illustrates the frequency response of the HPF for the bias current $I_B=0.2$ mA, according to aspects of the present disclosure.

The HPF circuit 410 using AIS was simulated for total harmonic distortion (THD) using different bias currents (For example, $I_B$=0.2 mA, 1 mA, and 2 mA). The observed THD was 0.484%, 0.019%, and 0.005% respectively which is within the acceptable range. The frequency response was also carried out for the bias current of 0.2 mA. FIG. 12A is an exemplary illustration of the frequency response of the HPF 410 for bias current $I_B$=0.2 mA. Curve 1210 represents the frequency response of the HPF 410 with respect to gain of the HPF 410.

Figure 12B:
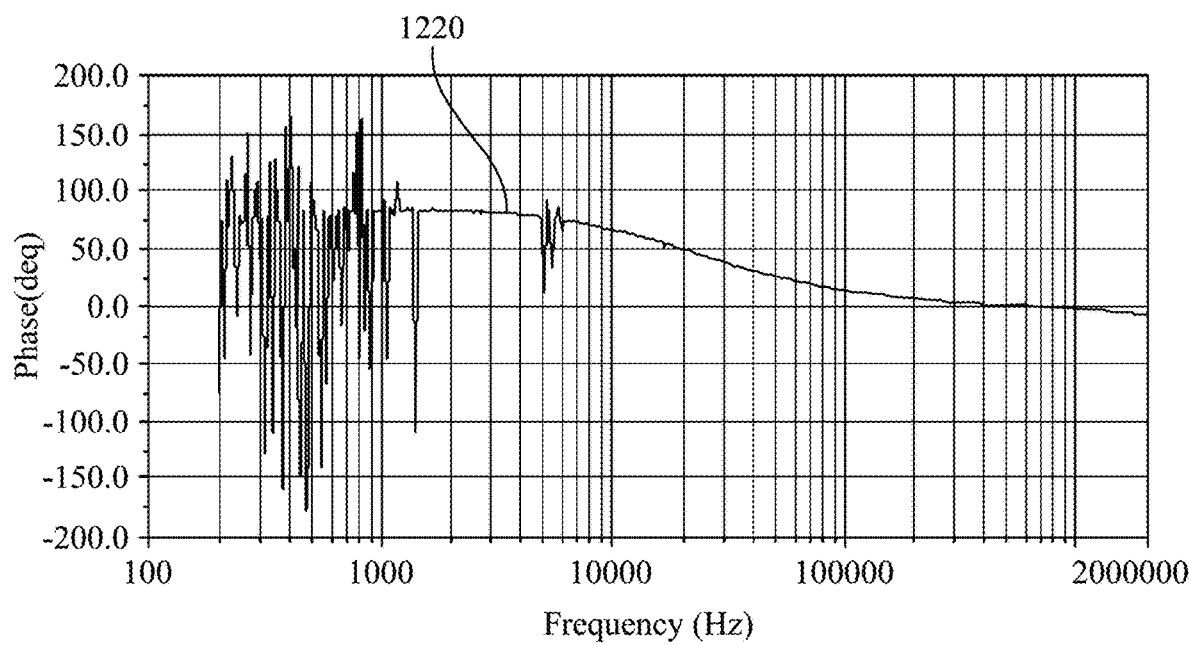
FIG. 12B illustrates the frequency response of the HPF for the bias current $I_B=2$ mA, according to aspects of the present disclosure.

FIG. 12B is another exemplary illustration of the frequency response of the HPF for bias current $I_B$=0.2 mA. Curve 1220 represents the frequency response of the HPF 410 with respect to phase of the HPF 410. It can be observed from FIG. 12A-FIG. 12B that there is a small deviation, due to parasitic effects on the low frequency side.

The performance of the present circuit 100 is compared with the existing circuits and is summarized in Table 1. It can be observed from the comparison table that the present circuit 100 is efficient in comparison to all cited existing circuits.

TABLE 1

Summary of performance comparison

| Circuits | No. of active building block used: (ABB) | Number of passive elements # of R # of C Grounded (Floating) elements G(F) | G(F) | Power supply | Technology μm | Frequency range (Hz) | Impedance/ Simulated (±AIS, ±R & ±C multiplier) |
|---|---|---|---|---|---|---|---|
| Conventional simulated inductor with reduced series resistors using a single VCII+ | 1 VCII | ±0.9 | 0.18 | (2) | 1 | 1 KHz-10 MHz | ±AIS only |
| Conventional simulated inductors with reduced parasitic impedance effects | 3 CFOA | NA | NA | 2(1) | 1(0) | 1 μHz-1 MHz | ±AIS only |
| Conventional lossless and lossy grounded inductor simulators | 1 CFOA | ±15 | NA | 1(1) | 0(1) | NA | ±AIS only |
| Conventional active device based grounded inductor simulator and universal filter | 2CFOA | ±5 | NA | | | | |
| Conventional extremely Low power temperature insensitive electronically tunable VCII-Based Grounded Capacitance Multiplier | 1 E-VCII | ±0.3 | 0.18 | 0 | (1) | 80 Hz-40 KHz | ±C multiplier only |
| Conventional simulated grounded inductor based on two NICs, two resistors and a grounded capacitor | 1 INIC, 1 VNIC | ±0.75 | 0.13 | 0(2) | 1(0) | 100 Hz-50 MHz | ±AIS |

TABLE 1-continued

Summary of performance comparison

| Circuits used: | No. of active building block (ABB) | Number of passive elements # of R Grounded (Floating) elements G(F) | # of C Grounded (Floating) elements G(F) | Power supply | Technology μm | Frequency range (Hz) | Impedance/ Simulated (±AIS, ±R & ±C multiplier) |
|---|---|---|---|---|---|---|---|
| Conventional Inverting Voltage Buffer Based Lossless Grounded Inductor Simulators | 1 MD VCC | ±0.75 | 0.13 | 0(2) | 1(0) | | ±AIS |
| Present circuit 100 | 1 VCII and 1 OTA | ±5 | NA | 1(1) | 1 | 100 Hz-10 MHz | All |

The first embodiment is illustrated with respect to FIG. 1-FIG. 4C. The first embodiment describes a tunable grounded positive and negative active inductor simulator and impedance multiplier circuit 100. The circuit 100 includes a second generation voltage-mode conveyor circuit (VCII+) 110, a voltage source $V_s$, a first impedance $Z_1$, a second impedance $Z_2$, and an operational transconductance amplifier OTA 120. The second generation voltage-mode conveyor circuit (VCII+) 110 is configured with a positive VCII+ input terminal Y, a first output terminal Z, and a second output terminal X. The VCII+ 110 has a current gain β, and a voltage gain α. The voltage source $V_s$ is configured to generate an output current $I_s$, at a frequency s. The first impedance $Z_1$ is connected between the voltage source and the positive VCII+ input terminal Y, wherein an internal circuit of the first impedance $Z_1$, includes a resistor $R_1$, in parallel with a capacitor, $C_1$. The second impedance $Z_2$ is connected between the second output terminal X, and a ground terminal, wherein an internal circuit of the second impedance $Z_2$, includes a resistor $R_2$, in parallel with a capacitor $C_2$. The OTA 120 is configured to have a transconductance gain $g_m$, wherein the OTA includes a positive OTA input terminal 125, a negative OTA input terminal 130, an OTA output terminal 135, and a current bias $I_B$, input terminal. The positive OTA input terminal 125 is connected to one of the first output terminal Z and the ground terminal. The negative OTA input terminal 130 is connected to one of the first output terminal Z and the ground terminal. The OTA output terminal 135 is connected to the first impedance $Z_1$. The grounded positive and negative active inductor simulator and impedance multiplier circuit is configured to be tunable by a selection of a value for $R_1$, a value for $C_1$, a value for $R_2$ and a value for $C_2$.

In an aspect, the OTA 120 is configured to generate an output current $I_o$. The positive VCII+ input terminal Y is configured to receive an input current $I_y$, equal to the difference between $I_s$ and $I_0$. The first output terminal Z is configured to generate a voltage, $V_z$. The second output terminal X is configured to generate a voltage $V_x$, across the second impedance $Z_2$, and a current $i_x$, through the second impedance $Z_2$, wherein $i_x=\pm\beta I_y$ and $V_z=\alpha V_x$. The output current $I_o$ is given by $I_o=I_x Z_2 g_m=-I_y Z_2 g_m$, and a voltage at the positive VCII+ input terminal Y, is given by $V_y$, where $V_y=0$.

In an aspect, the positive OTA input terminal 125 is connected to the first output terminal Z. The negative OTA input terminal 130 is connected to the ground terminal, such that an input impedance $Z_{in}$, of the VCII+ is given by $$Z_{in} = \frac{Z_1}{1 + Z_2 g_m},$$

where $Z_2 g_m$ is ≤1.

In an aspect, a tunable positive active inductor simulator is configured by setting $Z_1=R_1$, $C_1=0$, $R_2=0$ and $Z_2=1/sC_2$, such that the input impedance is given by $$Z_{in} = sC_2 \frac{R_1}{20 \times I_B} = sL$$

where $$L = C_2 \frac{R_1}{20 \times I_B},$$

and a value of the inductor, L, is tuned by the selection of the value of $C_2$ and the value of $R_1$.

In an aspect, a tunable positive capacitance multiplier is configured by setting $Z_1=1/sC_1$, $R_1=0$, $Z_2=R_2$, and $C_2=0$, such that the input impedance is given by $$Z_{in} = \frac{1}{sC_1(1 + 20 \times R_2 I_B)},$$

in which the capacitance, $C_1$, is multiplied by $(1+20 \times R_2 I_B)$, and an amount of multiplication of $C_1$ is tuned by the selection of the value of $R_2$.

In an aspect, a tunable positive resistance multiplier is configured by setting $Z_1=R_1$, $C_1=0$, $Z_2=R_2$, $C_2=0$, such that the input impedance is given by $$Z_{in} = \frac{R_1}{(1 - 20 \times R_2 I_B)},$$

in which $R_1$ is multiplied by $$\frac{1}{(1 - 20 \times R_2 I_B)},$$

where $0 \leq 20 \times R_2 I_B < 1$, and an amount of multiplication of $R_1$ is tuned by the selection of the value of $R_2$.

In an aspect, the positive OTA input terminal 125 is connected to the ground terminal, the negative OTA input terminal 130 is connected to the first output terminal Z, and an input impedance $Z_{in}$, of the VCII+ is given by $$Z_{in} = \frac{Z_1}{1 + Z_2 g_m},$$

where $Z_2 g_m > 1$.

In an aspect, a tunable negative active inductor simulator is configured by setting $Z_1=R_1$, $C_1=0$, $R_2=0$ and $Z_2=1/sC_2$, such that the input impedance is given by Z $$Z_{in} = -sC_2 \frac{R_1}{20 \times I_B} = -sL$$

where $$L = C_2 \frac{R_1}{20 \times I_B},$$

and a value of the inductor, L, is tuned by the selection of the value of $C_2$ and the value of $R_1$.

In an aspect, a tunable negative active capacitance multiplier is configured by setting $Z_1=1/sC_1$, $R_1=0$, $Z_2=R_2$, and $C_2=0$, such that the input impedance is given by Z $$Z_{in} = -\frac{1}{sC_1(1 + 20 \times R_2 I_B)},$$

in which the capacitance $C_1$ is multiplied by $(20 \times R_2 I_B)$, and an amount of multiplication of $C_1$ is tuned by the selection of the value of $R_2$.

In an aspect, a tunable negative resistance multiplier is configured by setting $Z_1=R_1$, $C_1=0$, $Z_2=R_2$, $C_2=0$, such that the input impedance is given by Z $$Z_{in} = -\frac{R_1}{(1 - 20 \times R_2 I_B)},$$

in which $R_1$ is multiplied by $$-\frac{1}{(1 - 20 \times R_2 I_B)},$$

where $0 \leq 20 \times R_2 I_B < 1$, and an amount of multiplication of $R_1$ is tuned by the selection of the value of $R_2$.

The second embodiment is illustrated with respect to FIG. 1-FIG. 4C. The second embodiment describes a method for implementing a tunable grounded positive and negative active inductor simulator and impedance multiplier circuit 100. The method includes selecting one second generation voltage-mode conveyor circuit VCII+ 110, configured with a positive VCII+ input terminal Y, a first output terminal Z, and a second output terminal X, wherein the VCII+ has a current gain, $\beta$; and a voltage gain, $\alpha$. The method includes connecting a first impedance $Z_1$, to the positive VCII+ input terminal Y, wherein an internal circuit of the first impedance $Z_1$, includes a resistor $R_1$, in parallel with a capacitor $C_1$. The method includes connecting a voltage source $V_s$ to the first impedance $Z_1$, wherein the voltage source $V_s$ is configured to generate an output current $I_s$ at a frequency s. The method further includes connecting a second impedance $Z_2$ between the second output terminal X, and a ground terminal.

The method further includes selecting one operational transconductance amplifier OTA 120 configured to have a transconductance gain $g_m$, wherein the OTA 120 includes a positive OTA input terminal 125, a negative OTA input terminal 130, and an OTA output terminal 135. The method further includes connecting the positive OTA input terminal 125 to one of the first output terminal Z, and the ground terminal, connecting the negative OTA input terminal 130 to one of the first output terminal Z, and the ground terminal, connecting the OTA output terminal 135 to the first impedance $Z_1$, such that: the OTA is configured to generate an output current $I_o$, the positive VCII+ input terminal is configured to receive an input current $I_y$, equal to the difference between $I_s$ and $I_O$. The first output terminal Z is configured to generate a voltage $V_z$. The second output terminal X is configured to generate a voltage $V_x$, across the second impedance $Z_2$, and a current $i_x$, through the second impedance $Z_2$, wherein $i_x = \pm \beta I_y$ and $V_z = \alpha V_x$. The output current $I_o$ is given by $I_o = I_x Z_2 g_m = -I_y Z_2 g_m$, and a voltage at the positive VCII+ input terminal Y is given by $V_y$, where $V_y = 0$.

The method further includes connecting the positive OTA input terminal 125 to the first output terminal Z, and connecting the negative OTA input terminal 130 to the ground terminal, such that an input impedance, $Z_{in}$, of the VCII+ is given by Z $$Z_{in} = \frac{Z_1}{1 + Z_2 g_m},$$

where $Z_2 g_m$ is $\leq 1$.

The method further includes configuring a tunable positive active inductor simulator by setting $Z_1=R_1$, $C_1=0$, $R_2=0$ and $Z_2=1/sC_2$, such that the input impedance is given by $$Z_{in} = sC_2 \frac{R_1}{20 \times I_B} = sL$$

where $$L = C_2 \frac{R_1}{20 \times I_B},$$

and tuning a value of the inductor, L, by selecting the value of $C_2$ and the value of $R_1$.

The method further includes configuring a tunable positive capacitance multiplier by setting $Z_1=1/sC_1$, $R_1=0$, $Z_2=R_2$, and $C_2=0$, such that the input impedance is given by $$Z_{in} = \frac{1}{sC_1(1+20 \times R_2 I_B)},$$

in which the capacitance, $C_1$, is multiplied by $(1+20 \times R_2 I_B)$, and tuning an amount of multiplication of $C_1$ by selecting the value of $R_2$.

The method further includes configuring a tunable positive resistance multiplier by setting $Z_1=R_1$, $C_1=0$, $Z_2=R_2$, $C_2=0$, such that the input impedance is given by $$Z_{in} = \frac{R_1}{(1-20 \times R_2 I_B)},$$

in which $R_1$ is multiplied by $$\frac{1}{(1-20 \times R_2 I_B)},$$

where $0 \leq 20 \times R_2 I_B < 1$, and tuning an amount of multiplication of $R_1$ by selecting the value of $R_2$.

The method further includes connecting the positive OTA input terminal 125 is connected to the ground terminal, connecting the negative OTA input terminal 130 is connected to the first output terminal, Z, such that an input impedance, $Z_{in}$, of the VCII+ is given by $$Z_{in} = \frac{Z_1}{1+Z_2 g_m},$$

where $Z_2 g_m > 1$.

The method further includes a tunable negative active inductor simulator is configured by setting $Z_1=R_1$, $C_1=0$, $R_2=0$ and $Z_2=1/sC_2$, such that the input impedance is given by $$Z_{in} = -sC_2 \frac{R_1}{20 \times I_B} = -sL$$

where $$L = C_2 \frac{R_1}{20 \times I_B},$$

and a value of the inductor, L, is tuned by the selection of the value of $C_2$ and the value of $R_1$.

The method further includes a tunable negative active capacitance multiplier is configured by setting $Z_1=1/sC_1$, $R_1=0$, $Z_2=R_2$, and $C_2=0$, such that the input impedance is given by $$Z_{in} = -\frac{1}{sC_1(1+20 \times R_2 I_B)},$$

in which the capacitance, $C_1$, is multiplied by $(20 \times R_2 I_B)$, and an amount of multiplication of $C_1$ is tuned by the selection of the value of $R_2$.

The method further includes a tunable negative resistance multiplier is configured by setting $Z_1=R_1$, $C_1=0$, $Z_2=R_2$, $C_2=0$, such that the input impedance is given by $$Z_{in} = -\frac{R_1}{(1-20 \times R_2 I_B)},$$

in which $R_1$ is multiplied by $$-\frac{1}{(1-20 \times R_2 I_B)},$$

where $0 \leq 20 \times R_2 I_B < 1$, and an amount of multiplication of $R_1$ is tuned by the selection of the value of $R_2$.

The third embodiment is illustrated with respect to FIG. 1-FIG. 4C. The third embodiment describes a system for configuring a tunable grounded positive and negative active inductor simulator and impedance multiplier circuit 100. The system includes one second generation voltage-mode conveyor circuit (VCII+) 110, configured with a positive VCII+ input terminal Y, a first output terminal Z, and a second output terminal X, wherein the VCII+ has a current gain β; and a voltage gain α, a voltage source $V_s$, configured to generate an output current $I_s$, at a frequency s, a first impedance $Z_1$, connected between the voltage source and the positive VCII+ input terminal Y, wherein an internal circuit of the first impedance $Z_1$, comprises a resistor $R_1$, in parallel with a capacitor $C_1$, a second impedance $Z_2$, connected between the second output terminal X, and a ground terminal, wherein an internal circuit of the second impedance $Z_2$, comprises a resistor $R_2$, in parallel with a capacitor $C_2$, and an operational transconductance amplifier OTA 120, configured to have a transconductance gain $g_m$, wherein the OTA 120 includes a positive OTA input terminal 125, a negative OTA input terminal 130, an OTA output terminal 135, and a current bias $I_B$, input terminal, wherein: the positive OTA input terminal is connected to one of the first output terminal Z and the ground terminal, the negative OTA input terminal is connected to one of the first output terminal, Z and the ground terminal, and the OTA output terminal is connected to the first impedance $Z_1$, wherein the grounded positive and negative active inductor simulator and impedance multiplier circuit is configured to be tunable by a selection of a value for $R_1$, a value for $C_1$, a value for $R_2$ and a value for $C_2$. The OTA is configured to generate an output current, $I_o$. The positive VCII+ input terminal is configured to receive an input current $I_y$, equal to the difference between $I_s$ and $I_0$. The first output terminal Z is configured to generate a voltage $V_z$. The second output terminal X is configured to generate a voltage $V_x$, across the second impedance $Z_2$, and a current $i_x$, through the second impedance, $Z_2$, wherein $i_x=\pm\beta I_y$ and $V_z=\alpha V_x$. The output current $I_o$ is given by $I_o=I_x Z_2 g_m=-I_y Z_2 g_m$, and a voltage at the positive VCII+ input terminal Y, is given by $V_y$, where $V_y=0$. The positive OTA input terminal is connected to the first output terminal Z and the negative OTA input terminal is connected to the ground terminal, an input impedance $Z_{in}$, of the VCI+ is given by $$Z_{in} = \frac{Z_1}{1+Z_2 g_m},$$

where $Z_2 g_m$ is ≤1. The system is configured to implement any one of: a tunable positive active inductor simulator by setting $Z_1=R_1$, $C_1=0$, $R_2=0$ and $Z_2=1/sC_2$, such that the input impedance is given by $$Z_{in} = sC_2 \frac{R_1}{20 \times I_B} = sL$$

where $$L = C_2 \frac{R_1}{20 \times I_B},$$

and a value of the inductor, L, is tuned by the selection of the value of $C_2$ and the value of $R_1$, a tunable positive capacitance multiplier by setting $Z_1=1/sC_1$, $R_1=0$, $Z_2=R_2$, and $C_2=0$, such that the input impedance is given by $$Z_{in} = -\frac{1}{sC_1(1 + 20 \times R_2 I_B)},$$

in which the capacitance, $C_1$, is multiplied by $(1+20 \times R_2 I_B)$, wherein an amount of multiplication of $C_1$ is tuned by the selection of the value of $R_2$, and a tunable positive resistance multiplier by setting $Z_1=R_1$, $C_1=0$, $Z_2=R_2$, $C_2=0$, such that the input impedance is given by $$Z_{in} = -\frac{R_1}{(1 - 20 \times R_2 I_B)},$$

in which $R_1$ is multiplied by $$\frac{1}{(1 - 20 \times R_2 I_B)},$$

where $0 \leq 20 \times R_2 I_B < 1$, wherein an amount of multiplication of $R_1$ is tuned by the selection of the value of $R_2$; and when the positive OTA input terminal is connected to the ground terminal, the negative OTA input terminal is connected to the first output terminal, Z, such that an input impedance, $Z_{in}$, of the VCII+ is given by $$Z_{in} = \frac{Z_1}{1 + Z_2 g_m},$$

where $Z_2 g_m > 1$, the system is configured to implement any one of: a tunable negative active inductor simulator by setting $Z_1=R_1$, $C_1=0$, $R_2=0$ and $Z_2=1/sC_2$, such that the input impedance is given by $$Z_{in} = -sC_2 \frac{R_1}{20 \times I_B} = -sL$$

where $$L = C_2 \frac{R_1}{20 \times I_B},$$

wherein a value of the inductor, L, is tuned by the selection of the value of $C_2$ and the value of $R_1$, a tunable negative active capacitance multiplier by setting $Z_1=1/sC_1$, $R_1=0$, $Z_2=R_2$, and $C_2=0$, such that the input impedance is given by $$Z_{in} = -\frac{1}{sC_1(1 + 20 \times R_2 I_B)},$$

in which the capacitance, $C_1$, is multiplied by $(20 \times R_2 I_B)$, wherein an amount of multiplication of $C_1$ is tuned by the selection of the value of $R_2$, and a tunable negative resistance multiplier by setting $Z_1=R_1$, $C_1=0$, $Z_2=R_2$, $C_2=0$, such that the input impedance is given by $$Z_{in} = -\frac{R_1}{(1 - 20 \times R_2 I_B)},$$

in which $R_1$ is multiplied by $$-\frac{1}{(1 - 20 \times R_2 I_B)},$$

where $0 \leq 20 \times R_2 I_B < 1$, wherein an amount of multiplication of $R_1$ is tuned by the selection of the value of $R_2$.

Obviously, numerous modifications and variations of the present disclosure are possible in light of the above teachings. It is therefore to be understood that within the scope of the appended claims, the disclosure may be practiced otherwise than as specifically described herein.

The invention claimed is:

1. A tunable inductor simulator and impedance multiplier circuit, comprising:
   only one second-generation voltage-mode conveyor (VCII+), only one operational transconductance amplifier (OTA) and only two passive elements selected from the group consisting of a first impedance $Z_1$ and a second impedance $Z_2$;
   wherein the one second generation voltage-mode conveyor circuit (VCII+) is configured with a positive VCII+ input terminal Y, a first output terminal Z, and a second output terminal X, wherein the VCII+ has a current gain β; and a voltage gain α;
   a voltage source $V_s$, configured to generate an output current at a frequency s;
   wherein the first impedance $Z_1$ is connected between the voltage source and the positive VCII+ input terminal Y, wherein an internal circuit of the first impedance $Z_1$, comprises a resistor $R_1$, in parallel with a capacitor $C_1$;
   wherein the second impedance $Z_2$ is connected between the second output terminal X, and a ground terminal, wherein an internal circuit of the second impedance $Z_2$ comprises a resistor $R_2$ in parallel with a capacitor $C_2$; and
   wherein the operational transconductance amplifier OTA is configured to have a transconductance gain $g_m$, wherein the OTA includes a positive OTA input terminal, a negative OTA input terminal, an OTA output terminal, and a current bias $I_B$ input terminal, wherein:

the positive OTA input terminal is connected to one of the first output terminal Z and the ground terminal;

the negative OTA input terminal is connected to one of the first output terminal Z and the ground terminal; and the OTA output terminal is connected to the first impedance $Z_1$, wherein the active inductor simulator and impedance multiplier circuit is configured to be tunable by a selection of a value for $R_1$, a value for $C_1$, a value for $R_2$ and a value for $C_2$.

2. The inductor simulator and impedance multiplier circuit of claim 1, wherein:

the OTA is configured to generate an output current $I_o$;

the positive VCII+ input terminal is configured to receive an input current $I_y$, equal to the difference between $I_s$ and $I_0$;

the first output terminal Z is configured to generate a voltage $V_z$;

the second output terminal X is configured to generate a voltage $V_x$ across the second impedance $Z_2$ and a current $i_x$ through the second impedance $Z_2$, wherein $i_x = \pm \beta I_y$ and $V_z = \alpha V_x$;

the output current $I_o$ is given by $I_o = I_x Z_2 g_m = -I_y Z_2 g_m$; and a voltage at the positive VCII+ input terminal Y is given by $V_y$, where $V_y = 0$.

3. The inductor simulator and impedance multiplier circuit of claim 2, wherein:

the positive OTA input terminal is connected to the first output terminal Z;

the negative OTA input terminal is connected to the ground terminal, such that an input impedance $Z_{in}$ of the VCII+ is given by $$Z_{in} = \frac{Z_1}{1 + Z_2 g_m},$$

where $Z_2 g_m$ is $\leq 1$.

4. The inductor simulator and impedance multiplier circuit of claim 3, wherein:

a tunable positive active inductor simulator is configured by setting $Z_1 = R_1$, $C_1 = 0$, $R_2 = 0$ and $Z_2 = 1/sC_2$, such that the input impedance is given by $$Z_{in} = sC_2 \frac{R_1}{20 \times I_B} = sL$$

where $$L = C_2 \frac{R_1}{20 \times I_B};$$

and a value of the inductor L is tuned by the selection of the value of $C_2$ and the value of $R_1$.

5. The inductor simulator and impedance multiplier circuit of claim 3, wherein:

a tunable positive capacitance multiplier is configured by setting $Z_1 = 1/sC_1$, $R_1 = 0$, $Z_2 = R_2$, and $C_2 = 0$, such that the input impedance is given by $$Z_{in} = \frac{1}{sC_1(1 + 20 \times R_2 I_B)},$$

in which the capacitance $C_1$ is multiplied by $(1 + 20 \times R_2 I_B)$; and an amount of multiplication of $C_1$ is tuned by the selection of the value of $R_2$.

6. The inductor simulator and impedance multiplier circuit of claim 3, wherein:

a tunable positive resistance multiplier is configured by setting $Z_1 = R_1$, $C_1 = 0$, $Z_2 = R_2$, $C_2 = 0$, such that the input impedance is given by $$Z_{in} = \frac{R_1}{(1 - 20 \times R_2 I_B)},$$

in which $R_1$ is multiplied by $$\frac{1}{(1 - 20 \times R_2 I_B)},$$

where $0 \leq 20 \times R_2 I_B < 1$; and an amount of multiplication of $R_1$ is tuned by the selection of the value of $R_2$.

7. The inductor simulator and impedance multiplier circuit of claim 2, wherein:

the positive OTA input terminal is connected to the ground terminal;

the negative OTA input terminal is connected to the first output terminal Z; and an input impedance $Z_{in}$ of the VCII+ is given by $$Z_{in} = \frac{Z_1}{1 + Z_2 g_m},$$

where $Z_2 g_m > 1$.

8. The inductor simulator and impedance multiplier circuit of claim 7, wherein:

a tunable negative active inductor simulator is configured by setting $Z_1 = R_1$, $C_1 = 0$, $R_2 = 0$ and $Z_2 = 1/sC_2$, such that the input impedance is given by $$Z_{in} = -sC_2 \frac{R_1}{20 \times I_B} = -sL$$

where $$L = C_2 \frac{R_1}{20 \times I_B};$$

and a value of the inductor L is tuned by the selection of the value of $C_2$ and the value of $R_1$.

9. The inductor simulator and impedance multiplier circuit of claim 7, wherein:

a tunable negative active capacitance multiplier is configured by setting $Z_1 = 1/sC_1$, $R_1 = 0$, $Z_2 = R_2$, and $C_2 = 0$, such that the input impedance is given by $$Z_{in} = -\frac{1}{sC_1(1 + 20 \times R_2 I_B)},$$

in which the capacitance $C_1$ is multiplied by $(20 \times R_2 I_B)$; and an amount of multiplication of $C_1$ is tuned by the selection of the value of $R_2$.

10. The inductor simulator and impedance multiplier circuit of claim 8, wherein:

a tunable negative resistance multiplier is configured by setting $Z_1 = R_1$, $C_1 = 0$, $Z_2 = R_2$, $C_2 = 0$, such that the input impedance is given by $$Z_{in} = -\frac{R_1}{(1 - 20 \times R_2 I_B)},$$

in which $R_1$ is multiplied by $$-\frac{1}{(1 - 20 \times R_2 I_B)},$$

where $0 \leq 20 \times R_2 I_B < 1$; and an amount of multiplication of $R_1$ is tuned by the selection of the value of $R_2$.

* * * * *